US 6,570,255 B2

(12) United States Patent
Andricacos et al.

(10) Patent No.: US 6,570,255 B2
(45) Date of Patent: May 27, 2003

(54) METHOD FOR FORMING INTERCONNECTS ON SEMICONDUCTOR SUBSTRATES AND STRUCTURES FORMED

(75) Inventors: Panayotis Constantinou Andricacos, Croton-on-Hudson, NY (US); Cyril Cabral, Jr., Ossining, NY (US); John Michael Cotte, New Fairfield, CT (US); Lynne Gignac, Beacon, NY (US); Wilma Jean Horkans, Ossining, NY (US); Kenneth Parker Rodbell, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/191,015

(22) Filed: Jul. 8, 2002

(65) Prior Publication Data

US 2002/0171151 A1 Nov. 21, 2002

Related U.S. Application Data

(62) Division of application No. 09/755,899, filed on Jan. 4, 2001, now Pat. No. 6,429,523.

(51) Int. Cl.⁷ .......................... H01L 23/48; H01L 23/52
(52) U.S. Cl. ..................... 257/758; 257/751; 257/762; 438/622
(58) Field of Search ................................. 257/758, 751, 257/762; 438/622

(56) References Cited

U.S. PATENT DOCUMENTS

| | | | |
|---|---|---|---|
| 5,654,228 A | * 8/1997 | Shieh et al. | 438/32 |
| 6,043,153 A | 3/2000 | Nogami et al. | 438/687 |
| 6,242,349 B1 | 6/2001 | Nagomi et al. | 438/687 |
| 6,251,772 B1 | * 6/2001 | Brown | 438/625 |
| 6,261,946 B1 | * 7/2001 | Iacoponi et al. | 257/774 |
| 6,297,154 B1 | 10/2001 | Gross et al. | 438/663 |
| 6,316,359 B1 | * 11/2001 | Simpson | 438/629 |
| 6,451,682 B1 | * 9/2002 | Fujikawa et al. | 438/618 |

\* cited by examiner

*Primary Examiner*—David Nelms
*Assistant Examiner*—Tu-Tu Ho
(74) *Attorney, Agent, or Firm*—Robert M. Trepp; Randy W. Tung

(57) ABSTRACT

A method for forming metal interconnect in a semiconductor structure and the structure formed are disclosed. In the method, a seed layer of a first metal is first deposited into an interconnect opening wherein the seed layer has an average grain size of at least 0.0005 μm. The semiconductor structure is then annealed at a temperature sufficient to grow the average grain size in the seed layer to at least the film thickness. A filler layer of a second metal is then deposited to fill the interconnect opening overlaying the seed layer such that the filler layer has an average grain size of larger than 0.0005 μm and comparable to the annealed seed layer.

17 Claims, 6 Drawing Sheets

0.2 μm

| Seed | Cu Seed Anneal | Seed $\rho_s$* ($\mu\Omega$cm) | Mean Diam. ($\mu$m) | Plate $\rho_s$* ($\mu\Omega$cm) |
|---|---|---|---|---|
| 60 nm seed | RT | 2.40 | 0.04 | 2.55 |
| 60 nm seed | 400C | 2.05 | 0.06 | 2.29 |
| 150 nm seed | RT | 1.95 | — | 2.47 |
| 150 nm seed | 400C | 1.59 | 0.17 | 2.02 |
*$\rho_s$ calculated from $R_s \cdot t_{Cu}$ only
Note: $\rho_s$ (plated Cu, post trans) ~ 2.0 $\mu\Omega$cm
$\rho_s$ (Cu, textbook) = 1.7 $\mu\Omega$cm
Cu electron mean free path (RT) = 39 nm
FIG. 9
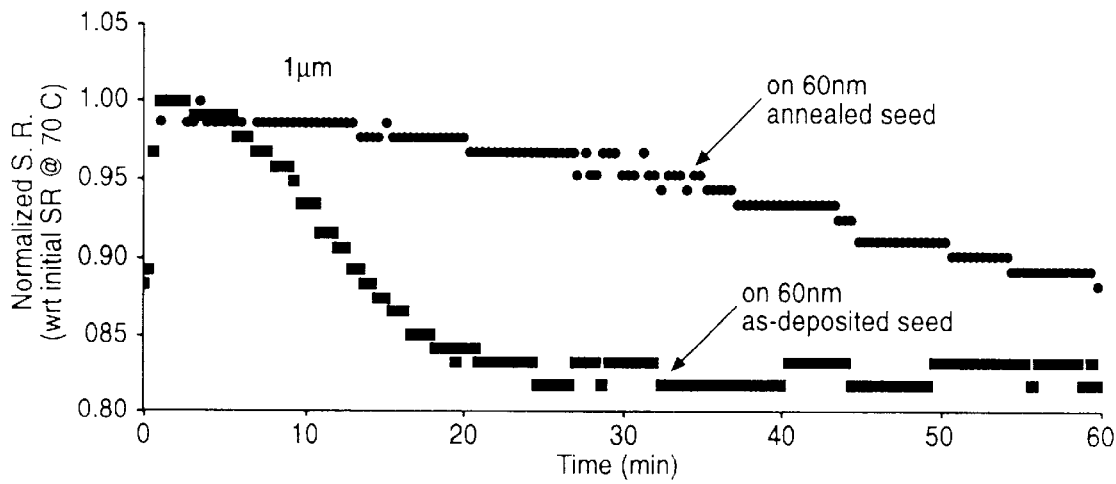
FIG. 10
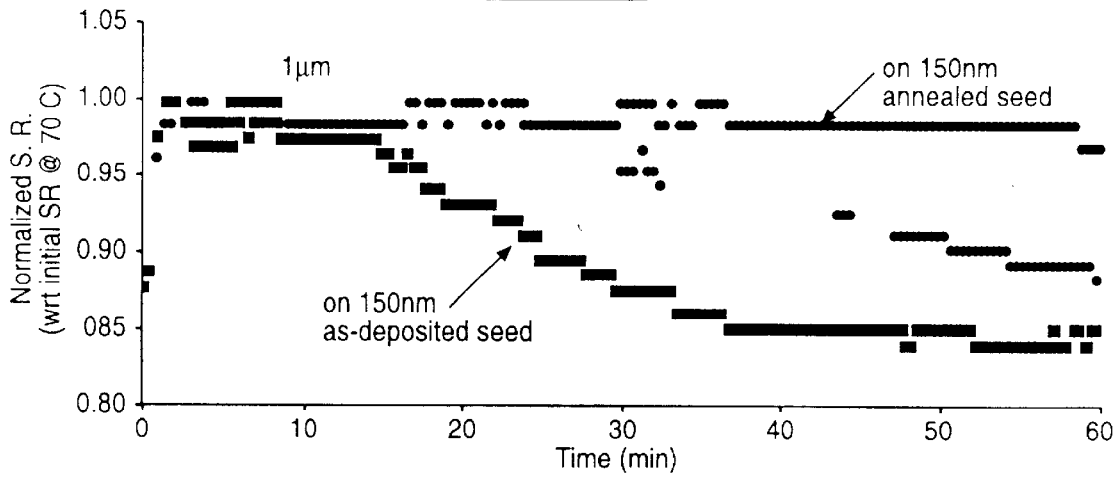
FIG. 11

METHOD FOR FORMING INTERCONNECTS ON SEMICONDUCTOR SUBSTRATES AND STRUCTURES FORMED

This is a divisional of application(s) Ser. No. 09/755,899 filed on Jan. 4, 2001 is now U.S. Pat. No. 6,429,523.

FIELD OF THE INVENTION

The present invention generally relates to a method for forming an electrical conductor in an electronic structure and more particularly, relates to a method for forming interconnects in a semiconductor structure and structures formed.

BACKGROUND OF THE INVENTION

The technology of making metal conductors to provide for vias, lines and other recesses in semiconductor chip structures, flat panel displays and package applications has been developed in the past decade. For instance, in developing interconnection technology for very-large-scale-integrated (VLSI) structures, aluminum has been utilized as the primary metal source for contacts and interconnects in semiconductor regions or devices located on a single substrate. Aluminum has been the material of choice because of its low cost, good ohmic contact and high conductivity. However, pure aluminum thin-film conductors have undesirable properties such as a low melting point which limits its use to low temperature processing and possible diffusion into the silicon during annealing which leads to contact and junction failure, and poor electromigration resistance. Consequently, a number of aluminum alloys have been developed which provided advances over pure aluminum.

Recently developed ULSI technology has placed more stringent demands on the wiring requirements due to the extremely high circuit densities and faster operating speeds required of such devices. This leads to higher current densities in increasingly smaller conductor lines. As a result, higher conductance wiring is desired which requires either larger cross-section wires for aluminum alloy conductors or a different wiring material that has a higher conductance. The obvious choice in the industry is to develop the latter which includes pure copper for its desirable high conductivity.

In the formation of ULSI interconnection structures such as vias and lines, copper can be deposited into such recesses to interconnect semiconductor regions or devices located on the same substrate. However, copper is known to have problems in semiconductor devices. The electromigration phenomenon occurs when the superposition of an electric field onto random thermal diffusion in a metallic solid causes a net drift of atoms in the direction of electron flow. This can lead to degradation in interconnect reliability. Diffusion of copper atoms into the silicon substrate or ILD can also cause device failure and poor reliability. In addition, pure copper does not adhere well to oxygen-containing dielectrics such as silicon dioxide and polyimide. To fully utilize copper in interconnection technology, the adhesion, diffusion and electromigration properties of copper must be improved control.

A schematic of an enlarged, cross-sectional view of an electronic structure that utilizes conventional interconnections made of a copper or copper alloys is shown in FIG. 1. The electronic structure 10 contains two levels of copper interconnections 12, 16 and one stud level 14 illustrating a copper wiring structure formed in a Damascene process on a pre-fabricated device 20. The device 20 is built on a semi-conducting substrate 24. As shown in FIG. 1, a typical Damascene level is first fabricated by the deposition of an ILD stack 26. The ILD stack 26 is then patterned and etched using standard lithograph and dry etch techniques to produce a desired wiring or via pattern. The process is then followed by the metal depositions of a thin adhesion/diffusion barrier liner 18 and copper or copper alloy metallurgy 12 wherein a bottom capping layer such as silicon nitride layer 28 is used as a diffusion barrier/etch stop which is previously deposited on top of the device 20 to protect against copper diffusion. After the copper or copper alloy interconnection 12 is formed, a top cap layer such as a silicon nitride layer 32 is deposited and used as an etch stop layer for defining the next level copper interconnection 14. After a second level ILD stack 34 is deposited, a recess for an interconnect is etched into the ILD stack 34 and the silicon nitride layer 32.

An interlevel copper alloy stud 14 with liner 22 is then deposited by a technique similar to that used in depositing the first level copper or copper alloy interconnection 12. A variety of metal deposition techniques can be used for filling the trench or via. These techniques include a collimated sputtering process, an ionized sputtering process, a hollow cathode magnetron sputtering process, a chemical vapor deposition process, an electroless plating process and an electrolytic plating process. Other techniques such as a co-deposition method in which copper and an alloying element are co-deposited can also be used in forming the copper alloys. For instance, the co-deposition methods include co-sputtering, "alloy plating", sequential plating of different materials with subsequent annealing, chemical vapor deposition, sequential chemical vapor deposition and co-evaporation. After the completion of the interlevel copper alloy stud 14, another similar process is repeated to form the second level copper interconnection 16 with liner 24 in a third ILD stack layer 38. An etch stop layer 36 such as silicon nitride is utilized between the stud and the second level interconnections. Finally, a top capping layer 42 is deposited on top of the copper wiring structure 10 for protecting the device from the environment.

More recently, void-free and seamless conductors are produced by electroplating copper from plating baths that contain additives. The capability of the electroplating method to superfill structural features without leaving voids or seams is unique and superior to that of other deposition techniques. Electrolytic copper plating techniques used in damascene structures can be defect-free if the deposited seed layer is continuous and has a uniform thickness even in the deepest area of the structural feature to be plated. The copper seed layer is typically deposited by a physical vapor deposition technique or other techniques over a barrier layer that prevents diffusion of copper into the insulator such as Ta, TaN, TiN or TaSiN. When the deposited seed layer is too thin at the bottom or near-bottom walls of a structural feature, plating does not occur and a void is created.

In order to eliminate the non-continuous deposition problem occurring during sputtering of a copper seed layer, a seed layer of a larger thickness is normally deposited. The deposition of a thick seed layer helps to eliminate the plated Cu voiding problem, however, it creates another one of equal or even greater significance, i.e. poor electromigration resistance in the resultant structure. The poor electromigration resistance of the structure is caused by the fact that the seed layer itself has weak electromigration resistance when compared to the much higher electromigration resistance of the plated film. It is also noted that in future generations of chips, the seed layer will contribute an increasing part of the total structure based on the decreasing dimensions of the features and the inability to decrease the thickness of the seed layer proportionally for reason stated above as well as the thickness uniformity requirements in electrolytic plating.

The Cu damascene process consists of the formation of trenches and vias in a dielectric material (such as $SiO_2$), which stops at an etch-stop shown as layer 46 in FIG. 2 filling the vias and trenches with a metal stack containing a barrier layer followed by Cu and then removing the excess metal from the field region typically by chemical/mechanical polishing. This is shown in FIGS. 2A and 2B, for a single damascene structure 50 and a dual damascene structure 40, respectively. When Cu damascene interconnects are produced using plated Cu, typically a physical vapor deposition Cu film 26 (seed layer) is deposited on the barrier layer to improve the substrate conductivity and to allow for uniform Cu plating. The as-plated Cu 44 is fine grained (0.05–0.2 µm grain size) but at room temperature over time, the Cu grains will grow to about 1~5 µm in size.

It is desirable for the interconnect microstructure to be large grained for electromigration and stress voiding purposes because grain boundary diffusion is minimized. Since the room temperature grain growth can occur over a time period of 1–4 days and is dependent on plated film thickness and impurity content, it is not practical to wait for room temperature grain growth prior to further processing. Therefore, a typical plated Cu damascene process requires that plated Cu be annealed post-plating but prior to chemical mechanical polishing (CMP) to allow grain growth to occur within 30~60 min. It has been shown that interconnects formed with a post-plate anneal have a higher incidence of stress voids than interconnects formed with a room temperature anneal. If the microstructure of the as-plated film is large grained, the anneal step would not be required.

It is therefore an object of the present invention to provide a method for forming interconnects in a semiconductor structure that does not have the drawbacks or shortcomings of the conventional methods.

It is another object of the present invention to provide a method for forming copper interconnects with large grains for improved electromigration and stress voiding proportions.

It is a further object of the present invention to provide a method for forming copper interconnects that have a bamboo or near bamboo microstructure.

It is another further object of the present invention to provide a method for forming copper interconnects of large grains by first forming a copper seed layer of large grains in the interconnect opening.

It is still another object of the present invention to provide a method for forming copper interconnects in a semiconductor structure by first depositing a copper seed layer in the interconnect opening and then annealing the copper seed layer until the grains are increased in size by at least 1.5 times.

It is still another further object of the present invention to provide a semiconductor structure that has at least one copper interconnect created by forming a seed layer such that the grain size of the filler layer is maximized.

It is yet another further object of the present invention to provide a semiconductor structure that has at least one copper interconnect formed therein by a copper seed layer having a thickness of 0.0005–0.50 µm and a copper filler layer having a grain size at least the thickness of the seed layer.

SUMMARY OF THE INVENTION

In accordance with the present invention, a method for forming copper interconnect in a semiconductor structure that has large copper grains and the structures formed are disclosed.

In a preferred embodiment, a method for forming metal interconnects in a semiconductor structure can be carried out by the operating steps of first providing a semiconductor structure that has an interconnect opening formed therein, depositing a seed layer of a first metal that has an average grain size between 0.0005–0.50 µm in the interconnect opening, heating the semiconductor structure to a temperature sufficient to grow the average grain size of the seed layer by at least a factor of 1.5 times and depositing a filler layer of a second metal in the interconnect opening overlaying the seed layer such that the filler layer of the second metal has a final average grain size comparable to the average grain size of the seed layer.

The method for forming metal interconnects in a semiconductor structure may further include the step of depositing the filler layer of a second metal that is the same as the first metal in the seed layer, or the step of depositing the seed layer and the filler layer in Cu. The method may further include the steps of depositing the filler layer in Au and depositing the seed layer in Au or Pt, or the steps of depositing the filler layer in Cu and depositing the seed layer in Pt, or the steps of depositing the filler layer in Ni and depositing the seed layer in Ni. The method may further include the step of heating the seed layer prior to depositing the filler layer to a temperature between about 50° C. and about 500° C., or preferably to a temperature between about 300° C. and about 400° C. when the first metal is Cu, or the step of heating the semiconductor structure to a temperature between about 50° C. and about 500° C. in a reducing atmosphere of forming gas or in an inert gas. The method may further include the step of heating the semiconductor structure for a time period of less than two hrs, or preferably between about ½ hr~1 hr in a furnace or 1 sec~100 sec in a RTA (rapid thermal annealing) when the first metal is Cu. The method may further include the step of depositing the seed layer to a thickness between above 0.0005 µm and about 0.5 µm.

The present invention is further directed to a semiconductor structure that includes an insulating material layer on a top surface of the semi-conductor structure, an interconnect opening in the insulating material layer, a diffusion barrier layer in the interconnect opening, a seed layer of a first metal on top of the diffusion barrier layer, the seed layer is formed of grains that have an average grain size of 0.0005–0.50 µm, and a filler layer of a second metal filling the interconnect opening formed of grains that have an average grain size at least 50% of the average grain size of the seed layer.

In the semiconductor structure, the diffusion barrier layer may be formed of refractory metal or refractory metal nitride. The first metal and the second metal may be of the same material. For example, first metal and the second metal are both Cu. The average grain size of the filler layer is at least 50% of the average grain size of the seed layer. The first metal may be Au or Pt, and the second metal may be Au. The first metal may be Pt, and the second metal may Cu. The first metal may be Ni, and the second metal may be Ni. The seed layer may have a thickness between about 0.0005 µm and about 0.5 µm, or preferably a thickness between about 0.005 µm and about 0.5 µm, or more preferably a thickness between about 0.05 µm and about 0.25 µm.

In another preferred embodiment, a method for forming a metal interconnect in a semiconductor structure can be carried out by the steps of first providing a semiconductor structure that has an interconnect opening formed therein, then depositing a seed layer of a first metal that has a thickness of at least 0.0005 µm in the interconnect opening, and depositing a filler layer of a second metal in the interconnect opening overlaying the seed layer such that the filler layer of the second metal has an average grain size comparable to the seed layer.

The method for forming an interconnect in a semiconductor structure may further include the step of depositing a diffusion barrier layer in the interconnect opening prior to the deposition step for the seed layer. The method may further include the step of depositing the seed layer and the filler layer of the same metal. For example, the step of depositing the seed layer and the filler layer in Cu. The method may further include the step of depositing the seed layer of Cu to a thickness of at least 0.0005–0.5 $\mu$m, or the step of depositing a seed layer of Cu to a thickness of at least 0.0005–0.50 $\mu$m such that the filler layer subsequently deposited has an average grain size comparable to the seed. The method may further include the step of depositing the seed layer of copper to a thickness between about 0.0005 $\mu$m and about 0.5 $\mu$m, or preferably between about 0.05 $\mu$m and about 0.25 $\mu$m. The method may further include the step of depositing the seed layer of Cu to a thickness between about 0.0005 $\mu$m and about 0.5 $\mu$m such that a subsequently deposited filler layer has an average grain size comparable to the thickness of the seed layer.

The present invention is further directed to a semiconductor structure that includes a dielectric material layer on top of the semiconductor structure, an interconnect opening in the dielectric material layer, a seed layer of a first metal in the interconnect opening that has a thickness of at least 0.0005–0.5 $\mu$m, and a filler layer of a second metal filling the interconnect opening that is formed of grains having an average grain size that is at least the thickness of the seed layer. The filler layer may be formed of grains that have an average grain size that is not larger than five times the thickness of the seed layer, or the filler layer may be formed of grains that have an average grain size comparable to the seed layer thickness. The first metal and the second metal may be Cu. The semiconductor structure may further include a layer of diffusion barrier between the interconnect opening and the seed layer. The first metal may be Au or Pt, while the second metal may be Au. The first metal may be Pt, and the second metal may be Au. The first metal may be Ni, and the second metal may be Ni.

BRIEF DESCRIPTION OF THE DRAWINGS

These and other objects, features and advantages of the present invention will become apparent from the following detailed description and the appended drawings in which:

FIG. 9 is a table illustrating data on various properties of the copper seed layers of different thicknesses and annealing temperatures.

FIG. 10 is a graph illustrating the dependency of the annealing time for 60 nm thick copper seed layers on the normalized sheet resistance.

FIG. 11 is a graph illustrating the dependency of the annealing time for 150 nm thick copper seed layers on the normalized sheet resistance.

DETAILED DESCRIPTION OF THE PREFERRED EMBODIMENT

Figure 1:
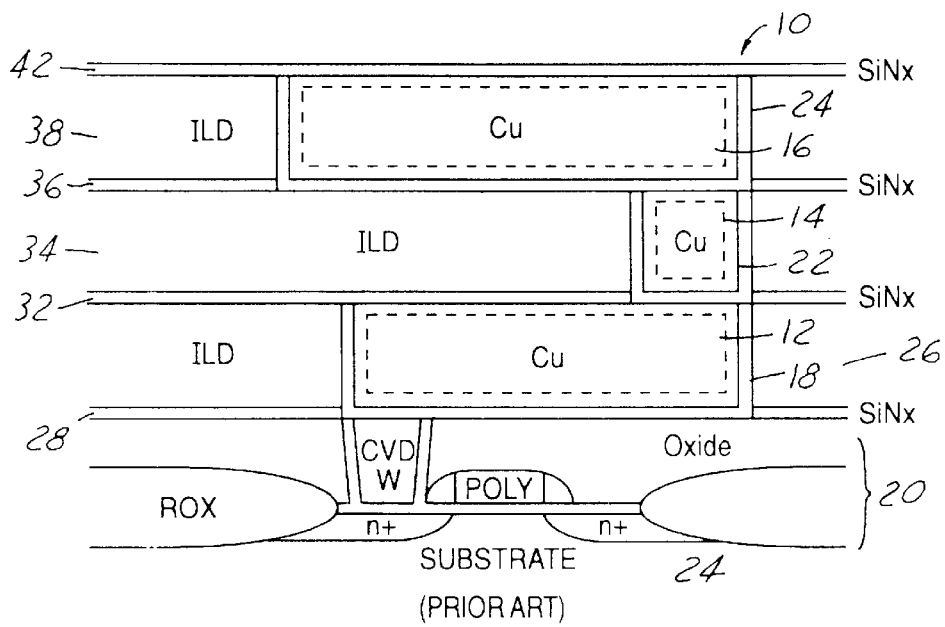
FIG. 1 is an enlarged, cross-sectional view of a conventional interconnection system utilizing copper and copper alloys.
Figure 2A:
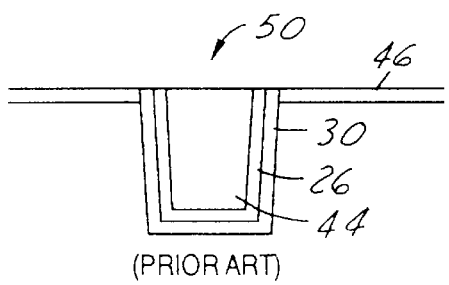
FIG. 2A is an enlarged, cross-sectional view of a conventional copper single damascene structure.
Figure 2B:
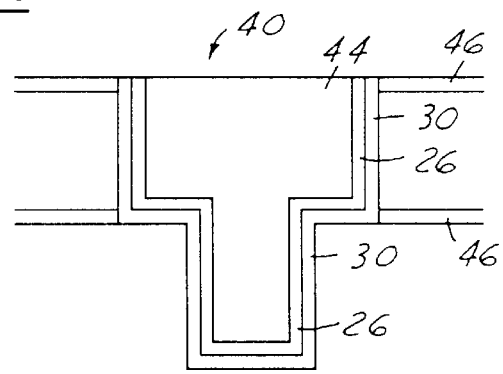
FIG. 2B is an enlarged, cross-sectional view of a conventional copper dual damascene interconnect structure.

The present invention discloses a method for forming a metal interconnect in a semiconductor structure with large grained metal of Cu, Au or Ni. The method can be carried out by either depositing a seed layer that has small grains and then annealing the seed layer prior to filling the interconnect opening such that the grain size of the seed layer grows to 0.0005–0.50 $\mu$m or 1.5× as-deposited grain size. The method may further be carried out by depositing a seed layer in the interconnect opening that has a minimal thickness such as 0.0005 $\mu$m, and then filling the interconnect opening with a metal such that the filler metal has an average grain size comparable to the seed layer. When the seed layer is Cu, the thickness of the seed layer deposited is 0.0005–0.50 $\mu$m such that the filler layer subsequently deposited, i.e. of Cu, has an average grain size comparable to the seed layer.

The present invention novel method produces semiconductor structures with interconnects formed of copper, or of any other suitable metal that has large grains with enhanced (111) Cu fiber texture for improved electromigration and stress voiding properties. The present invention method is developed to control the microstructure of as-plated Cu films and the resulting interconnects by controlling the microstructure of the seed layer. The novel method is also applicable to plated metal films other than Cu on various seed layers, for instance, Au on Au or Pt, Cu on Pt, Ni on Ni, etc.

In a typical Cu plating process, a seed layer is deposited by a sputter, CVD or electroless plating technique prior to Cu plating to achieve better substrate conductivity and improved plating uniformity. It is shown that the microstructure of the plated film mimics the microstructure of the seed layer by the present invention novel method. The method therefore controls the grain size and texture of the seed layer in order to control the resulting microstructure and various physical properties of the plated film. A major goal of the present invention is therefore to show that one can control the grain size in as-deposited plated Cu films. It is discovered that the microstructure of the seed layer can be controlled by several different methods, i.e. such as by varying the seed layer thickness; by annealing the seed layer; by using a thick seed layer either as-deposited or as-deposited and annealed followed by etching back the seed layer; by doping the seed layer with an impurity; by varying the deposition technique and parameters for the seed layer; and by selecting a suitable seed layer material. The present invention novel method therefore enables the tuning of the microstructure of the PVD seed layer to obtain the desirable microstructure in the plated Cu film.

Of the various proposed methods, three specific methods left out are described in detail, i.e. varying the seed layer thickness, annealing the seed layer and depositing a thick seed layer followed by etching back the film.

In the first method of varying the seed layer thickness, most PVD deposited films have an average grain size that is dependent on the film thickness where the average grain size will not be much larger than two to three times the film thickness. The grain size limitation is due to surface energy constraints where a grain boundary comes in contact with a free surface. Therefore, the grain structure of the seed layer can be controlled by controlling the seed layer thickness, i.e. thicker films produce larger grains.

In the annealing method, when larger seed layer grains are required for a given seed layer thickness, the seed layer can be annealed to grow the grains. Typically, grain growth occurs at a temperature between about 200° C. and about 250° C. In the context of this writing, the word "about" is to mean a range of values that is between ±10% of the average value given. While the grain size is limited by the film thickness, annealing has a finite effect on the grain size.

In the third method of thick seed layer deposition followed by etching-back the film, the method can be carried out by depositing a thick seed layer, or depositing and then annealing, followed by an etch-back process of the thick seed layer to a required process thickness. For instance, the thick seed layer may first be deposited to a thickness of at least 0.005 $\mu$m, a layer of the first metal used in depositing the seed layer is then removed from a top surface of the seed layer to a thickness that is at least 20% the thickness of the seed layer, and preferably to a thickness that is at least 40% of the thickness of the seed layer. The method is suitable when the grain size of the seed layer desired should be large, but the process constrains the thickness. The etch-back process can be accomplished by a variety of methods such as electro-etching, ion beam sputtering, reactive ion etching and chemical mechanical polishing.

The method enables one to deposit a thick seed layer (that has large grains) either annealed or without annealing, and then form a first surface layer of the film with a very large grained structure in a thin seed layer. For instance, when the electro-etch removal method is used, the following are the suitable process conditions: an electrolyte of 95% phosphoric acid; an electrode configuration of a sweeping fountain nozzle; a cathode material made of stainless steel; and inter-electrode distance of 3~4 mm; an electrolyte flow of 1~3 gpm; a cathode velocity of 0.1~3.0 cm/sec; an electrical potential of 4~10 volts DC; and a minimum of 8 pin contacts.

Figure 3A:
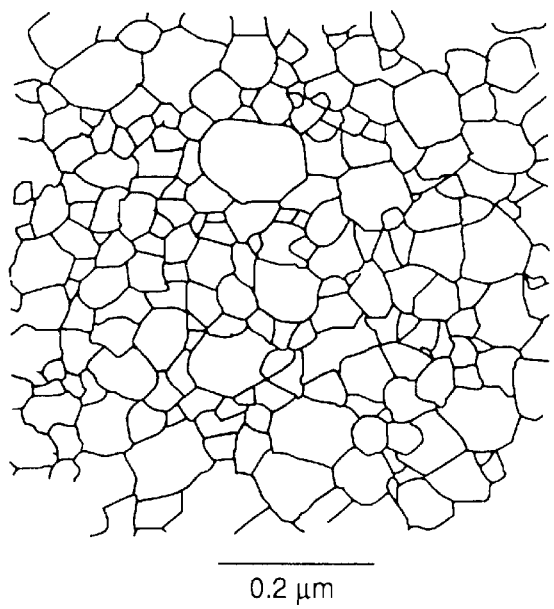
FIG. 3A is an enlarged, plan view trace of a present invention copper seed layer of 60 nm thickness.
Figure 3B:
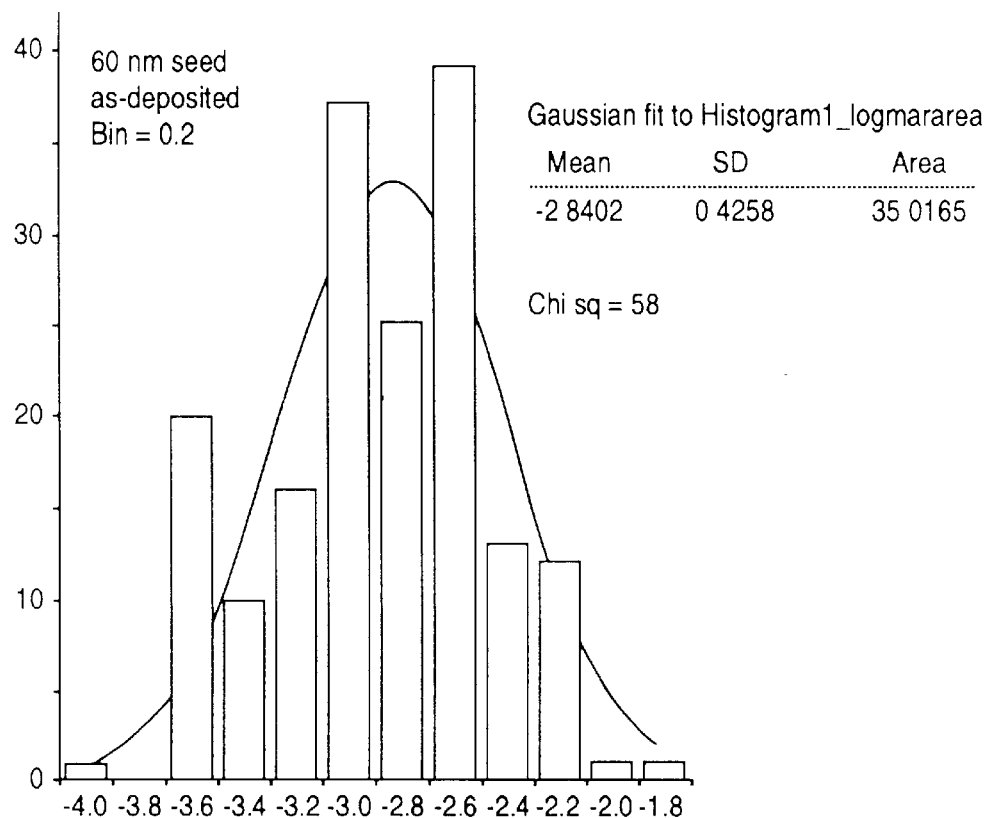
FIG. 3B is a graph illustrating the grain size distribution of the seed layer shown in FIG. 3A.

FIGS. 3A and 3B show a micrograph of a Cu seed layer as-deposited with a thickness of 60 nm, and a grain size distribution with average grain size of 0.04 $\mu$m, respectively. In this case, when a fine-grained plated film is desired, a PVD (physical vapor deposition) Cu seed layer is first deposited in the interconnect opening on an insulating material such as $SiO_2$. A suitable thickness such as 60 nm or less is normally used. A thin Cu film of less than 0.4 $\mu$m (or 400 nm) is then electroplated on top of the seed layer. The plated film should have grains approximately 0.05–2 $\mu$m in diameter.

Figure 4:
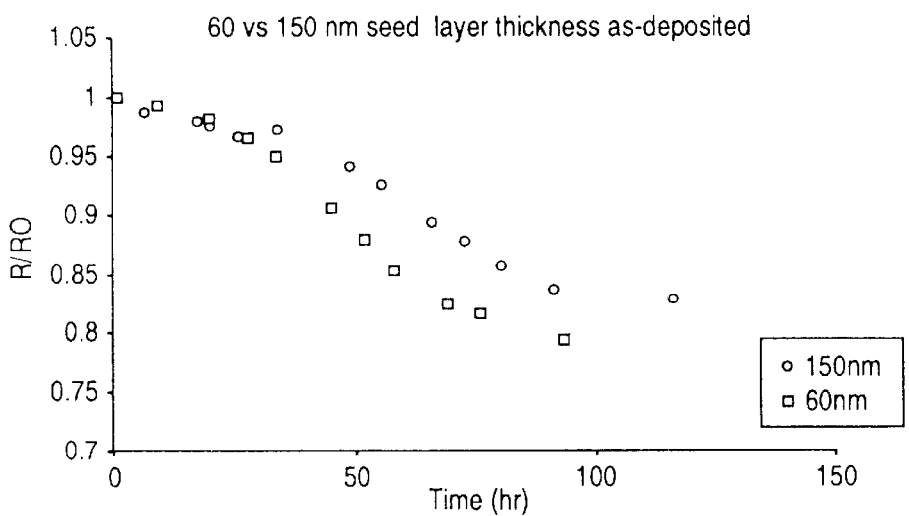
FIG. 4 is a graph illustrating the dependency of the copper seed layer thicknesses on the room temperature normalized resistance transient of plated Cu.

FIG. 4 is a graph illustrating the dependency of the plated Cu microstructure on the time for the relative resistance transient. It is seen that data obtained on both 60 nm thick and 150 nm thick seed layers show a faster resistance transient for the, 60 nm seed layer compared to the thicker 150 nm seed layer.

Figure 5A:
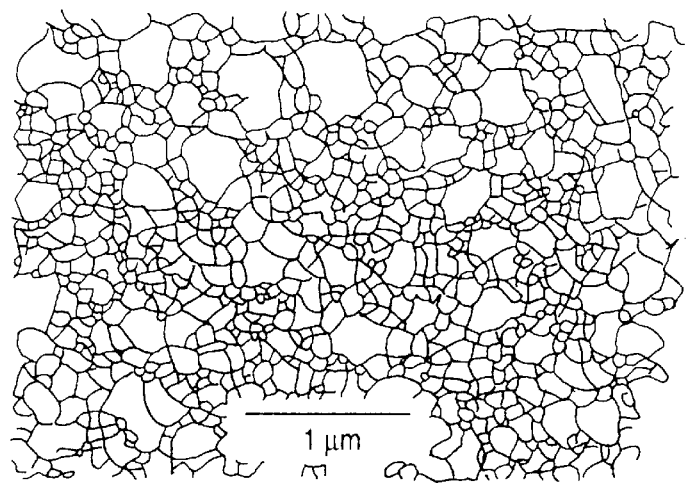
FIG. 5A is an enlarged, plan view image of the copper grains in a 60 nm copper seed layer after annealing at 400° C. for 1 hour.
Figure 5B:
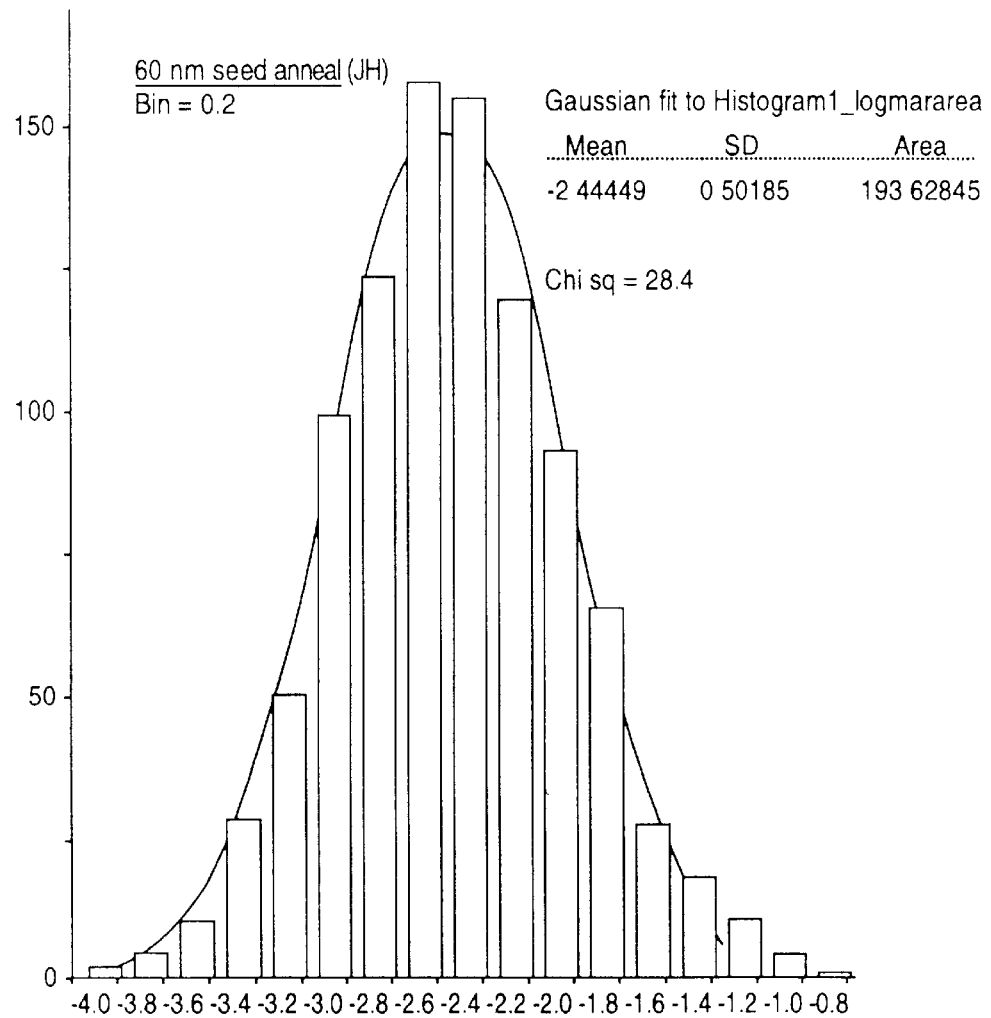
FIG. 5B is a graph illustrating the grain size distribution of the copper seed layer of FIG. 5A.

The next example shows a 60 nm thick Cu seed layer deposited by a PVD method, and then post-deposition annealed at 400° C. for 1 hour. A grain trace of the Cu seed layer and a graph illustrating the grain size distribution are shown in FIGS. 5A and 5B, respectively. The average grain size of the annealed seed layer, i.e. as indicated by the mean diameter, is about 0.06 $\mu$m, which is a 50% increase from 0.04 $\mu$m as shown in FIGS. 3A and 3B. These data are further shown in FIG. 9.

Figure 6A:
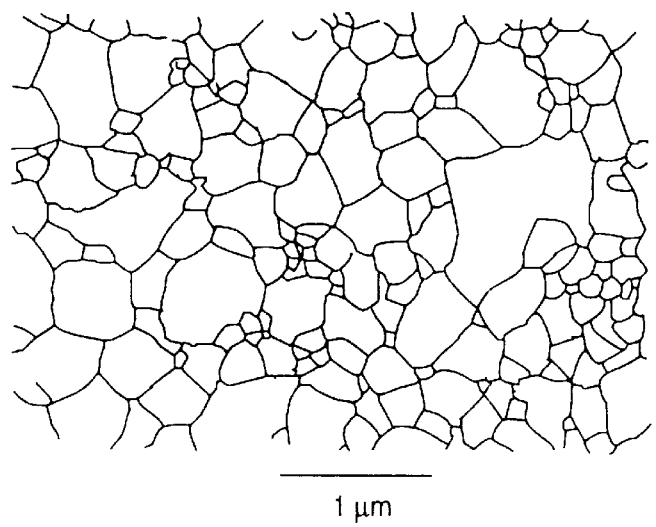
FIG. 6A is an enlarged, plan view trace of copper grains in a 150 nm copper seed layer after annealing at 400° C. for 1 hour.
Figure 6B:
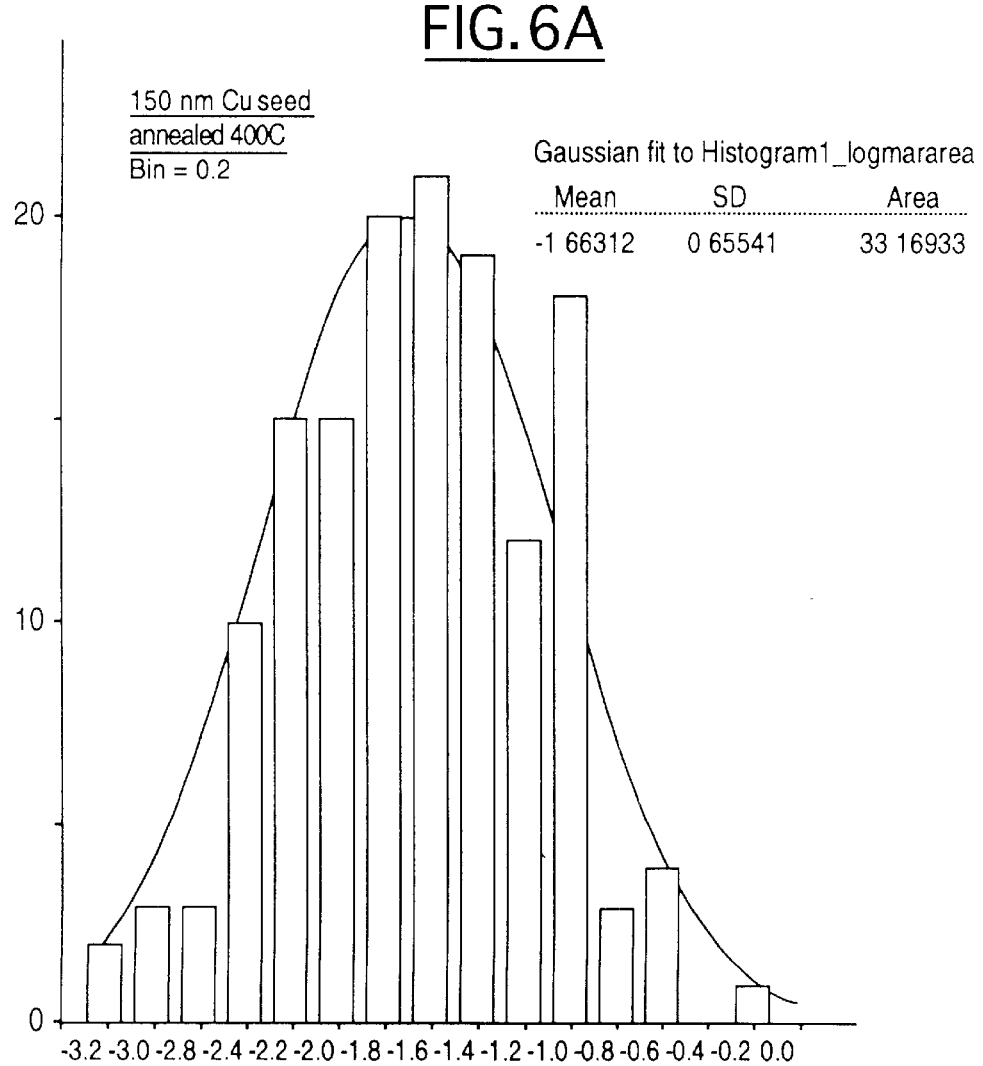
FIG. 6B is a graph illustrating grain size distribution in the copper seed layer of FIG. 6A.

FIGS. 6A and 6B illustrate a grain trace and grain size distribution of a seed layer that is first deposited to a 150 nm thickness and then annealed at 400° C. for one hour. In this example, the seed layer has an average grain size of 0.17 $\mu$m. The average grain size for the 150 nm annealed seed is 180% greater compared to the 60 nm seed.

In the above example, the sheet resistance of the seed layers was measured prior to plating and the films were also measured immediately after plating. The average grain size of three of the seed layers, i.e. 60 nm as-deposited, 60 nm as-annealed and 150 nm as-annealed, was determined.

Figure 7:
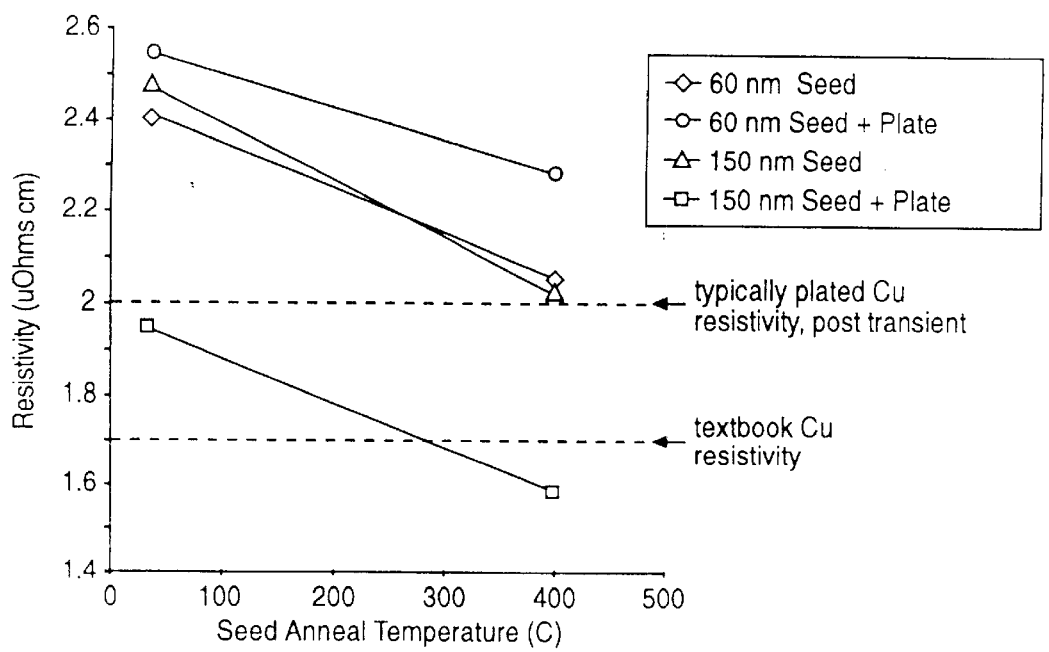
FIG. 7 is a graph illustrating the dependency of electrical resistivity on the seed annealing temperature for copper seed layers of 60 nm and 150 nm thickness.

Test data obtained on the resistivity and the sheet resistance are shown in FIGS. 7 and 9. As previously discussed, the average grain sizes of the three seed layers were 0.04 $\mu$m for 60 nm as-deposited seed layer, 0.06 $\mu$m for 60 nm as-annealed seed layer and 0.17 $\mu$m for 150 nm as-annealed seed layer. The sheet resistance of the layers was measured and the resistivity was determined by assuming the film thickness was equal to the nominal value and there was no contribution of the barrier film to the resistivity. The resistivity of the Cu seed layers are measured to be 2.4 $\mu\Omega$cm for the 60 nm as-deposited seed layer, 2.0 $\mu\Omega$cm for the 60 nm as-annealed seed layer, 1.95 $\mu\Omega$cm for the 150 nm-as-deposited seed layer and near bulk for the 150 nm as-annealed layer.

The textbook resistivity for bulk, single crystal Cu at room temperature is 1.7 $\mu\Omega$cm, as shown in FIG. 7 for comparison. It is shown that these data can be used for relative comparison of all films. The resistivity results show that thinner seed layers have higher resistivities than thicker seed layers. Furthermore, annealing can lower the resistance of the seed layer. The grain size data show that the difference in resistivity can be explained by increased grain boundary scattering due to smaller grains in thinner films and films which have not been annealed.

The resistivity of the plated Cu films, calculated with the same assumptions used for the PVD films, were found to be 2.6 $\mu\Omega$cm on the 60 nm as-deposited seed layer, 2.3 $\mu\Omega$cm cm on the 60 nm as-annealed seed layer, and 2.0 $\mu\Omega$cm on the 150 nm as-annealed seed layer. The resistivity data agreed with the microstructural characterization for the films with large grains that have lower resistivities. The plated film on 150 nm as-annealed seed layer has a resistivity similar to that of a typical plated Cu, i.e. about 2.0 $\mu\Omega$cm. The grains are very large, i.e. between 1~5 $\mu$m and the grain boundary scattering does not contribute as markedly to the resistivity as the other two films with smaller grains.

Figure 8:
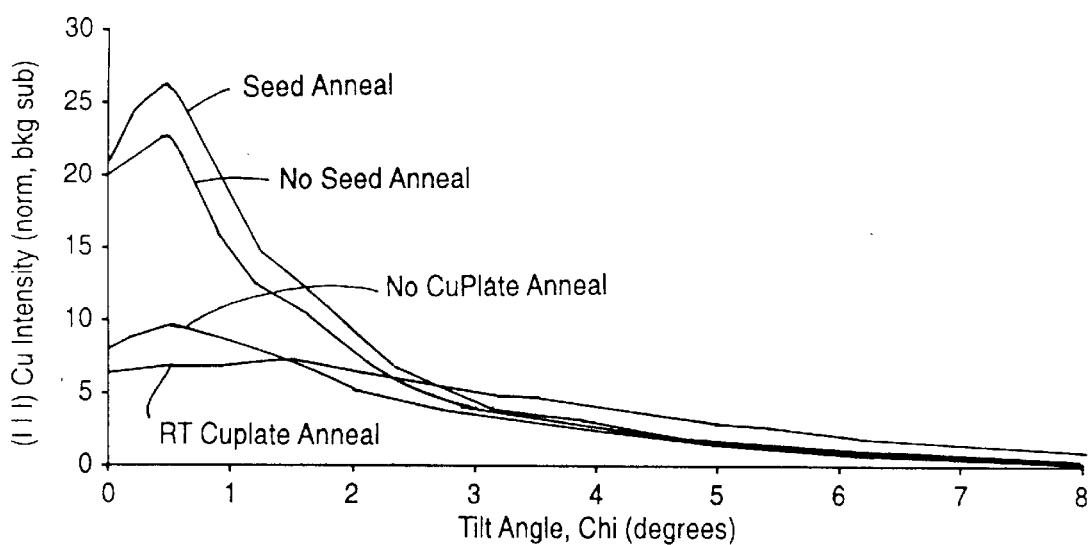
FIG. 8 is a graph illustrating the (111) Cu fiber texture for films with seed layer thickness of 60 nm with and without annealing the seed layer and Cu plated layer.

In FIG. 8, pole figures showing the intensity of the Cu (111) fiber texture is given for Cu films plated on: 1) a 60 nm as-deposited physical vapor deposition (PVD) seed layer (gray curves) and 2) a 60 nm PVD Cu seed layer annealed at 400° C. for 1 hour (black curves). The dotted lines represent texture data taken immediately after plating and the solid curves represent data taken after annealing the plated films for 7 days at 21° C. The data show that the (111) texture of a blanket plated Cu film is enhanced if the seed layer is annealed prior to plating. Enhanced (111) texture can lead to improved electromigration. There is also a slight increase in Cu (111) texture intensity if the plated Cu films are annealed at room temperature compared to the as-plated state. This texture increase is related to grain grow that occurs in plated Cu films at room temperature after plating.

In FIGS. 10 and 11, show normalized sheet resistance as a function of time (at 70° C.) of two plated Cu films on 60 nm as-deposited seed layer and 150 nm as-deposited seed layer is shown. Plated Cu exhibits a behavior where the Cu grains grow at room temperature over time from a very fine initial grain structure of about 0.05–0.2 $\mu$m average grain size to very large grains of about 1~5 $\mu$m. The phenomena is known as Cu resistance transient or plated Cu self-annealing. The sheet resistance of a plated Cu film decreases over time at room temperature as the grains grow. In FIGS. 10 and 11, a comparison of the plated Cu resistance transient shows a shorter transient for the unannealed seed layer in both cases. The film on the 150 nm as-deposited seed layer has a longer resistance transient than the film on the 60 nm as-deposited seed layer. The grain structure of the PVD seed layer controls not only the grain structure and the initial resistivity of the resulting plated Cu film, but also has an effect on the time dependent resistance behavior of the plated film.

The present invention novel method for forming a metal interconnect that has large grains and consequently, improved electromigration and sheet resistance has been amply described in the above description and in the appended drawings of FIGS. 3–11. The description clearly shows that the microstructure of a PVD Cu seed layer controls the microstructure of the subsequently plated Cu film. The resistivity and resistance transient of the plated Cu film are dependent on the microstructure of the PVD layer.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for forming metal interconnect in a semiconductor structure comprising the steps of:
   providing a semiconductor structure having an interconnect opening having sidewalls and a bottom formed therein,
   depositing a seed layer of a first metal having a thickness of at least 0.0005 $\mu$m in said interconnect opening, said first metal being selected from the group consisting of Au, Pt and Ni, and
   depositing a filler layer of a second metal in said interconnect opening overlaying said seed layer such that said filler layer of said second metal has an average grain size larger than 0.0005 $\mu$m, said second metal being selected from the group consisting of Au, Cu and Ni.

2. A method for forming metal interconnect in a semiconductor structure according to claim 1 further comprising the step of depositing a diffusion barrier layer in said interconnect opening prior to said deposition step for said seed layer.

3. A method for forming metal interconnect in a semiconductor structure according to claim 1 further comprising the step of depositing said seed layer and said filler layer of the same metal.

4. A method for forming metal interconnect in a semiconductor structure according to claim 1 further comprising the step of depositing said filler layer of Cu.

5. A method for forming metal interconnect in a semiconductor structure according to claim 1 further comprising the step of depositing said seed layer to a thickness of at least 0.0005 $\mu$m.

6. A method for forming metal interconnect in a semiconductor structure according to claim 1 further comprising the step of depositing said seed layer to a thickness of at least 0.0005 $\mu$m such that said filler layer subsequently deposited has an average grain size within ±20% of said average grain size of said seed layer.

7. A method for forming metal interconnect in a semiconductor structure according to claim 1 further comprising the step of depositing said seed layer to a thickness between about 0.0005 $\mu$m and about 0.50 $\mu$m.

8. A method for forming metal interconnect in a semiconductor structure according to claim 1 further comprising the step of depositing said seed layer to a thickness preferably between about 0.0005 $\mu$m and about 0.25 $\mu$m.

9. A method for forming metal interconnect in a semiconductor structure according to claim 1 further comprising the step of depositing said seed layer to a thickness between about 0.0005 $\mu$m and about 0.25 $\mu$m such that a subsequently deposited filler layer has an average grain size that is equal to or greater than the said thickness of the seed layer.

10. A semiconductor structure comprising:
    a dielectric material layer on top of said semiconductor structure,
    an interconnect opening having sidewalls and a bottom in said dielectric material layer,
    a seed layer formed of a first metal in said interconnect opening having a thickness of at least 0.0005 $\mu$m, said first metal being selected from the group consisting of Au, Pt and Ni, and
    a filler layer formed of a second metal filling said interconnect opening with grains having an average grain size that is at least the thickness of said seed layer, said second metal being selected from the group consisting of Au, Cu and Ni.

11. A semiconductor structure according to claim 10, wherein said filler layer being formed of grains having an average grain size that is larger than two times said thickness of the seed layer.

12. A semiconductor structure according to claim 10, wherein said filler layer being formed of grains having an average grain size between about 0.0005 $\mu$m and about 0.25 $\mu$m.

13. A semiconductor structure according to claim 10, wherein said second metal is Cu.

14. A semiconductor structure according to claim 10 further comprising a layer of diffusion barrier between said interconnect opening and said seed layer.

15. A semiconductor structure according to claim 10, wherein said first metal is Au or Pt, said second metal is Au.

16. A semiconductor structure according to claim 10, wherein said first metal is Pt, said second metal is Cu.

17. A semiconductor structure according to claim 10, wherein said first metal is Ni, said second metal is Ni.

* * * * *